(12) United States Patent
Kimura et al.

(10) Patent No.: US 9,756,759 B2
(45) Date of Patent: Sep. 5, 2017

(54) POWER TRANSMISSION APPARATUS

(71) Applicant: Sumitomo Heavy Industries, Ltd., Tokyo (JP)

(72) Inventors: Kazuhiro Kimura, Okayama (JP); Yoshiki Hayashi, Okayama (JP); Tetsuo Harii, Kanagawa (JP); Sadanori Ishihara, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 3 days.

(21) Appl. No.: 14/747,923

(22) Filed: Jun. 23, 2015

(65) Prior Publication Data

US 2015/0296658 A1    Oct. 15, 2015

Related U.S. Application Data

(63) Continuation of application No. PCT/JP2014/051244, filed on Jan. 22, 2014.

(30) Foreign Application Priority Data

Feb. 15, 2013  (JP) .................................. 2013-028350

(51) Int. Cl.
  *F16H 57/02*    (2012.01)
  *H05K 7/20*    (2006.01)
  *F16H 57/04*    (2010.01)
  *F16H 57/033*    (2012.01)

(52) U.S. Cl.
  CPC ..... *H05K 7/20145* (2013.01); *F16H 57/0416* (2013.01); *H05K 7/20154* (2013.01); *F16H 57/033* (2013.01); *F16H 57/0495* (2013.01)

(58) Field of Classification Search
  CPC ............ H05K 7/20145; F16H 57/0416; F16H 57/033; F16H 57/0415
  See application file for complete search history.

(56) References Cited

U.S. PATENT DOCUMENTS

| | | | | |
|---|---|---|---|---|
| 4,074,590 A | * | 2/1978 | Jorg .................... | F16H 57/0498 165/122 |
| 4,872,502 A | * | 10/1989 | Holzman ............ | F16H 57/0415 165/119 |
| 8,653,703 B2 | | 2/2014 | Kori et al. | |
| 8,967,334 B2 | | 3/2015 | Strauβ et al. | |
| 2012/0024098 A1 | * | 2/2012 | Strau .................... | F16H 57/0447 74/467 |
| 2012/0031214 A1 | * | 2/2012 | Strauss ............... | F16H 57/0447 74/467 |

FOREIGN PATENT DOCUMENTS

| | | | | |
|---|---|---|---|---|
| CN | | 2329143 Y | 7/1999 | |
| CN | WO | 2012123043 A1 | * 9/2012 | ........... F16H 57/031 |
| JP | | S53-141863 A | 12/1978 | |

(Continued)

*Primary Examiner* — Vicky Johnson
(74) *Attorney, Agent, or Firm* — Michael Best & Friedrich LLP

(57) ABSTRACT

Disclosed is a power transmission apparatus that is cooled by airflow sent from a fan and includes fins provided on side surfaces of a casing. The fins include upstream fins close to the fan and downstream fins distant from the fan. An interval between the upstream fins is smaller than an interval between the downstream fins.

12 Claims, 9 Drawing Sheets

(56) References Cited

FOREIGN PATENT DOCUMENTS

| | | | |
|---|---|---|---|
| JP | H05-137401 | A | 6/1993 |
| JP | H07-312847 | A | 11/1995 |
| JP | H09-093865 | A | 4/1997 |
| JP | 2008-235387 | A | 10/2008 |
| JP | 2011-211816 | A | 10/2011 |

* cited by examiner

POWER TRANSMISSION APPARATUS

RELATED APPLICATIONS

This is a continuation of International Patent Application No. PCT/JP2014/051244 filed on Jan. 22, 2014. Priority is claimed to Japanese Patent Application No. 2013-028350, filed Feb. 15, 2013, and International Patent Application No. PCT/JP2014/051244, the entire content of each of which is incorporated herein by reference.

BACKGROUND

Technical Field

Certain embodiments of the invention relate to a power transmission apparatus.

Description of Related Art

For example, a power transmission apparatus (transmission), which is cooled by airflow sent from a fan, is disclosed in the related art.

In the power transmission apparatus, fins are provided on a casing of the power transmission apparatus in order to improve cooling efficiency. The fins are formed so as to be concentrated on a surface of the casing on which the fan is provided.

SUMMARY

According to an embodiment of the invention, there is provided a power transmission apparatus that is cooled by airflow sent from a fan and includes fins provided on a side surface of a casing. The fins include upstream fins close to the fan and downstream fins distant from the fan, and an interval between the upstream fins is smaller than an interval between the downstream fins.

DETAILED DESCRIPTION

In the structure disclosed in the related art, the fins are formed on the surface on which the fan is provided. Accordingly, cooling is sufficiently performed near the fan, but the cooling of the apparatus is not necessarily performed sufficiently as a whole and should be strict in terms of a thermal load under a certain usage environment of the power transmission apparatus or the like.

A certain embodiment of the invention provides a power transmission apparatus that includes a portion distant from a fan and can be more efficiently cooled as a whole.

In the embodiment of the invention, fins receiving airflow are provided on side surfaces of the casing. Further, the fins include upstream fins close to the fan and downstream fins distant from the fan. An interval between the upstream fins is smaller than an interval between the downstream fins.

Accordingly, the interval between the upstream fins can be set to be small on the side close to the fan (the upstream side of airflow), so that a contact area between the airflow and the upstream fins is increased and heat exchanging efficiency is improved. Meanwhile, the interval between the downstream fins can be set to be large on the side distant from the fan (the downstream side of airflow), so that the loss of pressure is reduced and the flow of the airflow is not inhibited. As a result, since it is possible to obtain a smoother airflow while more effectively using the airflow sent from the fan, it is possible to improve the cooling performance of the entire power transmission apparatus.

According to the embodiment of the invention, it is possible to obtain a power transmission apparatus that can be more efficiently cooled as a whole.

An example of an embodiment of the invention will be described in detail below with reference to the drawings.

Figure 1:
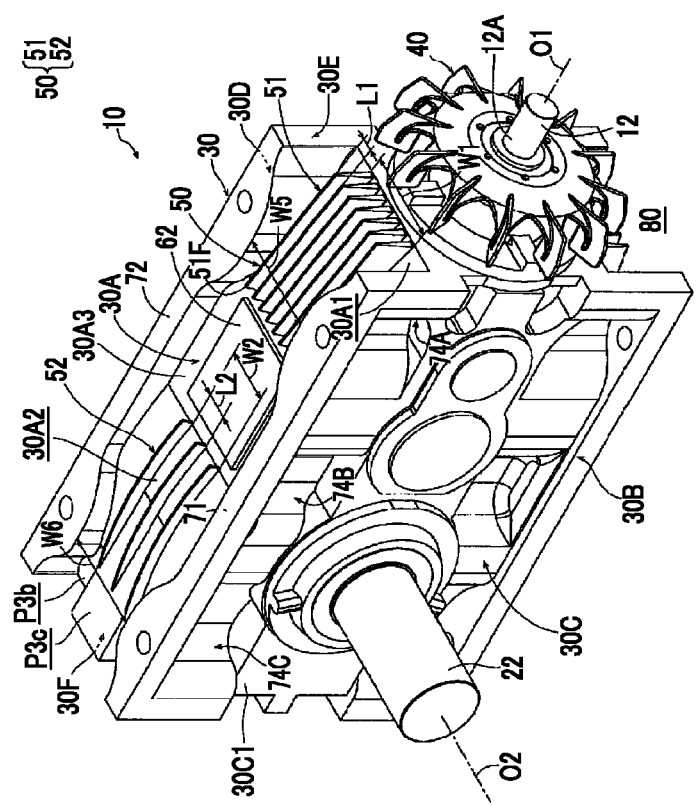
FIG. 1 is a perspective view showing the structure of a speed reducer (power transmission apparatus) according to an example of an embodiment of the invention.
Figure 2:
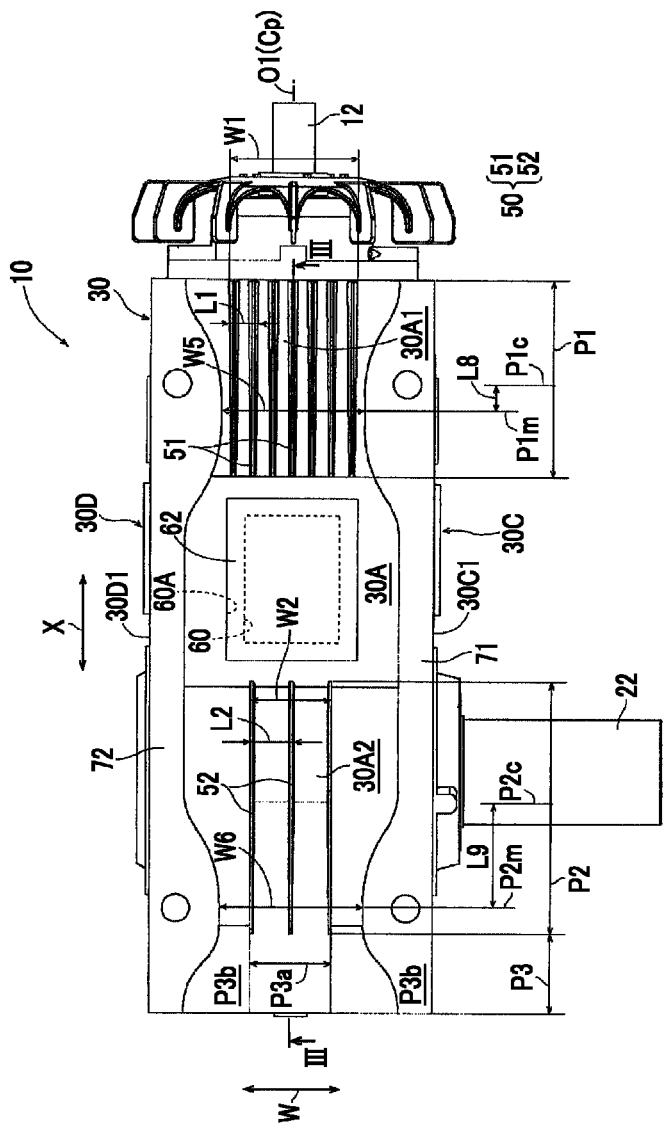
FIG. 2 is a plan view of the speed reducer.
Figure 3:
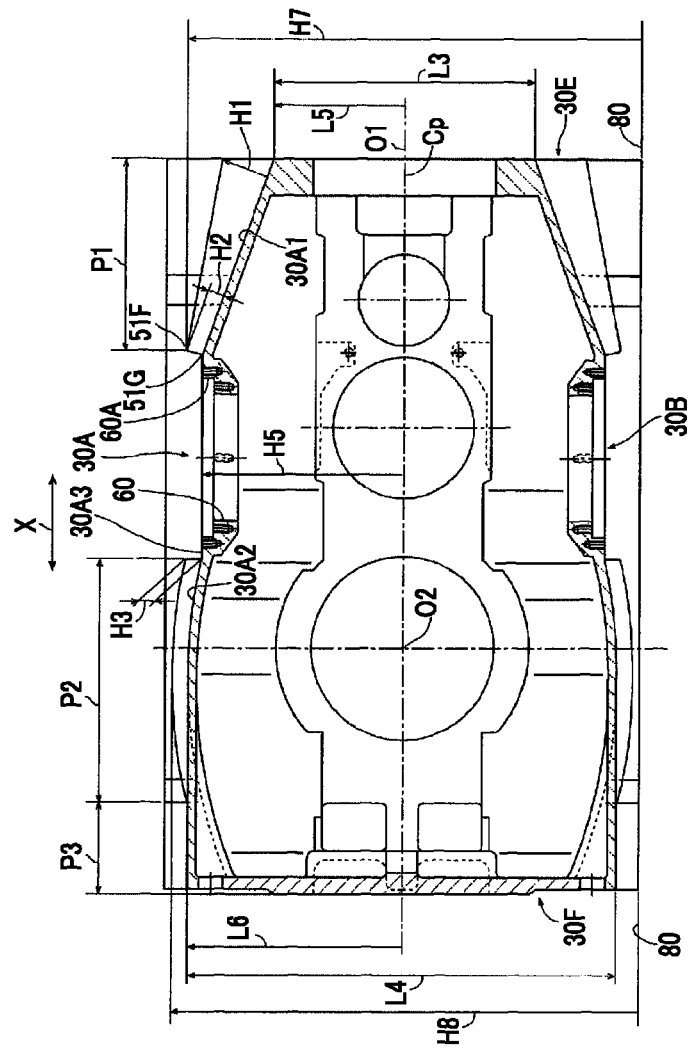
FIG. 3 is a cross-sectional view of a casing portion of the speed reducer taken along line III-III of FIG. 2.
Figure 4:
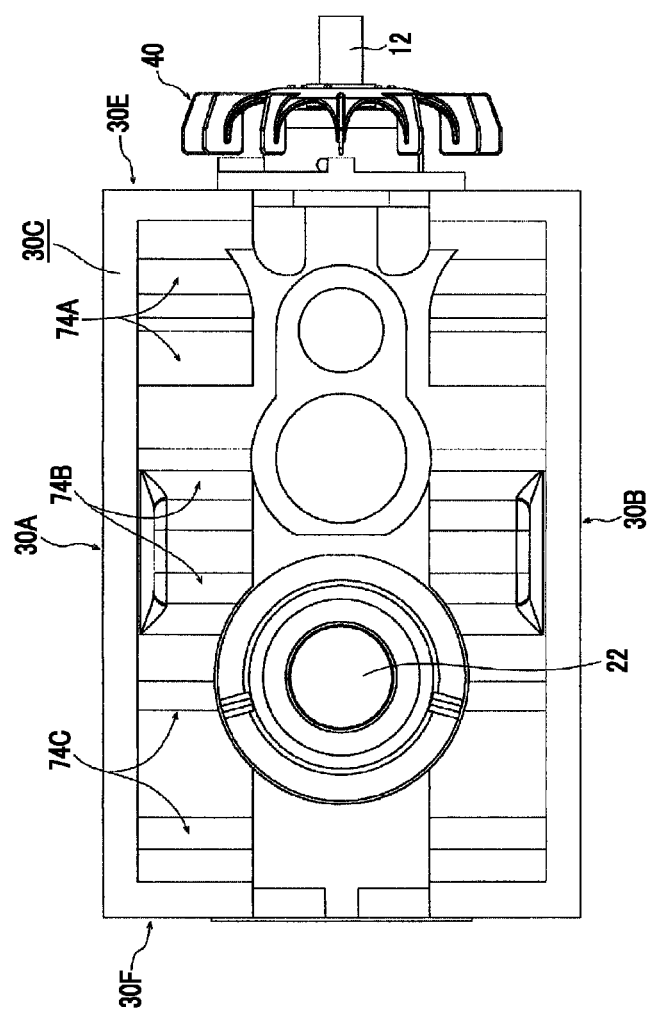
FIG. 4 is a front view of the speed reducer.
Figure 5:
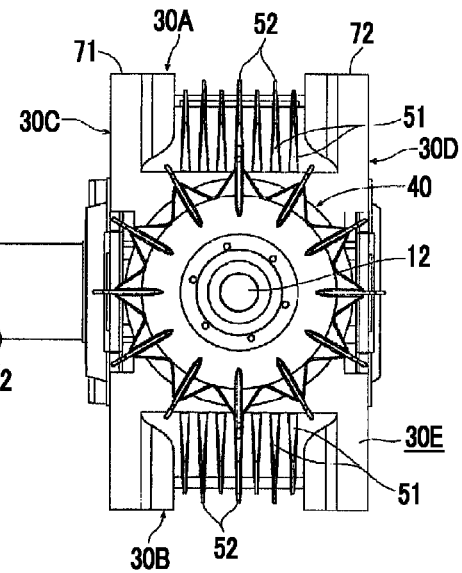
FIG. 5 is a right side view of the speed reducer.
Figure 6:
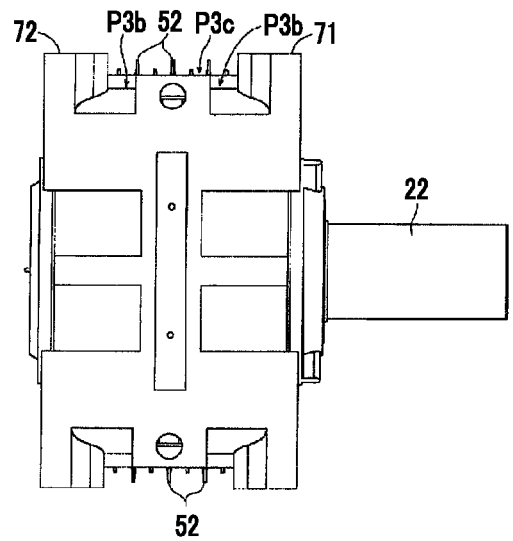
FIG. 6 is a left side view of the speed reducer.
Figure 7:
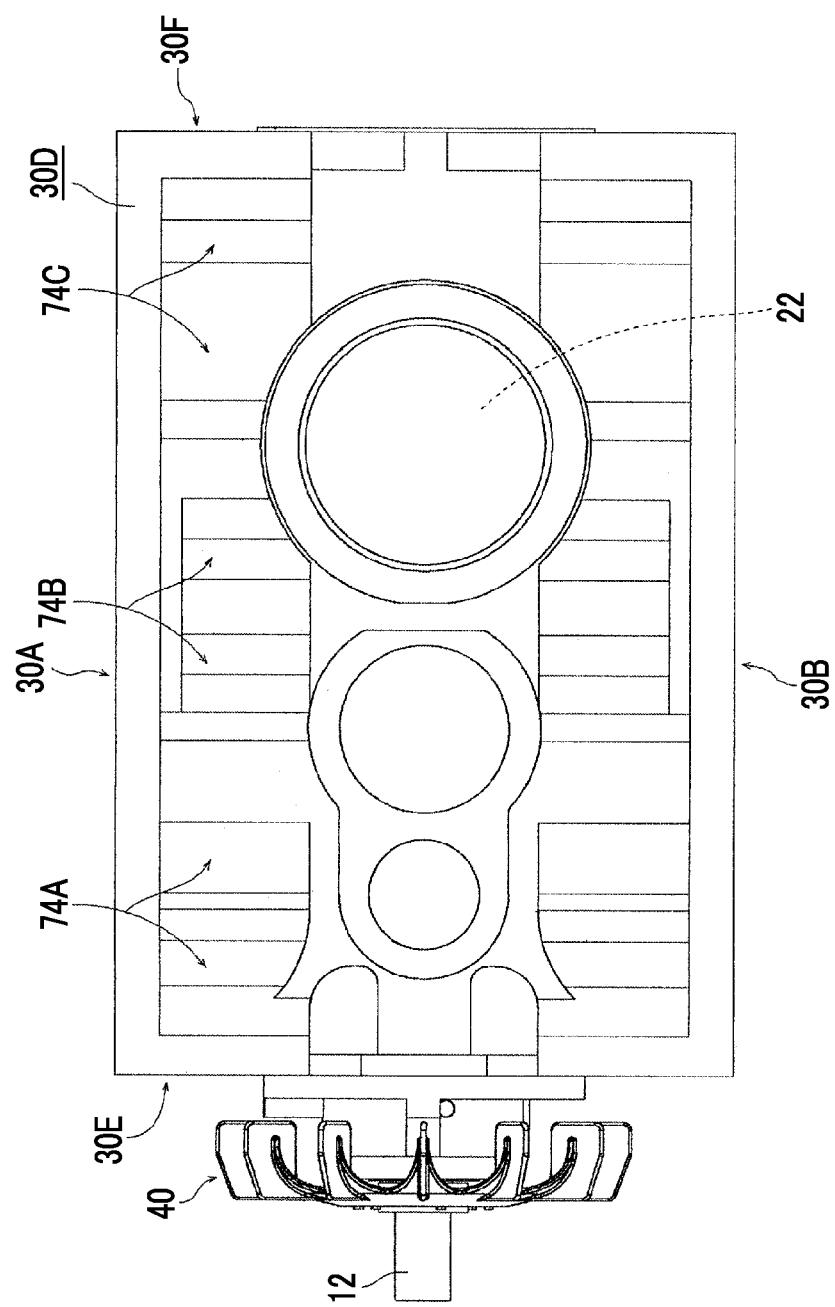
FIG. 7 is a rear view of the speed reducer.
Figure 8:
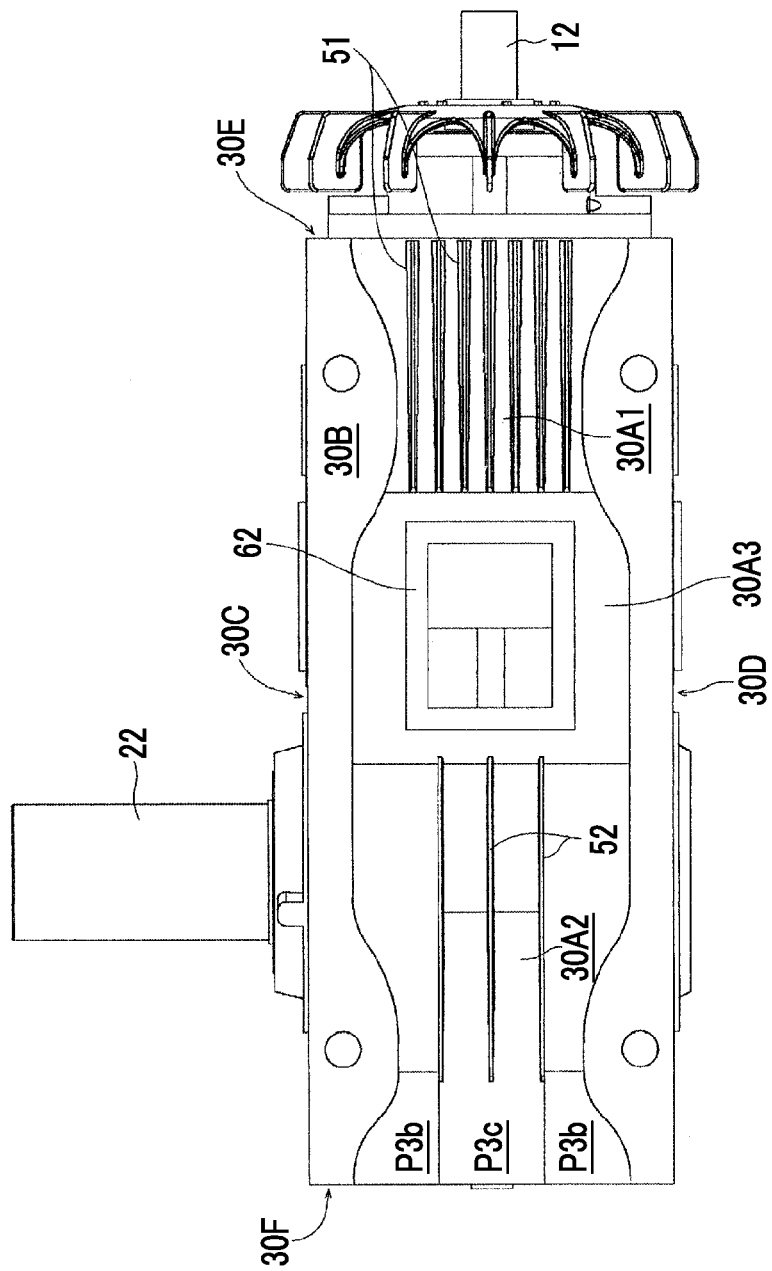
FIG. 8 is a bottom view of the speed reducer.
Figure 9:
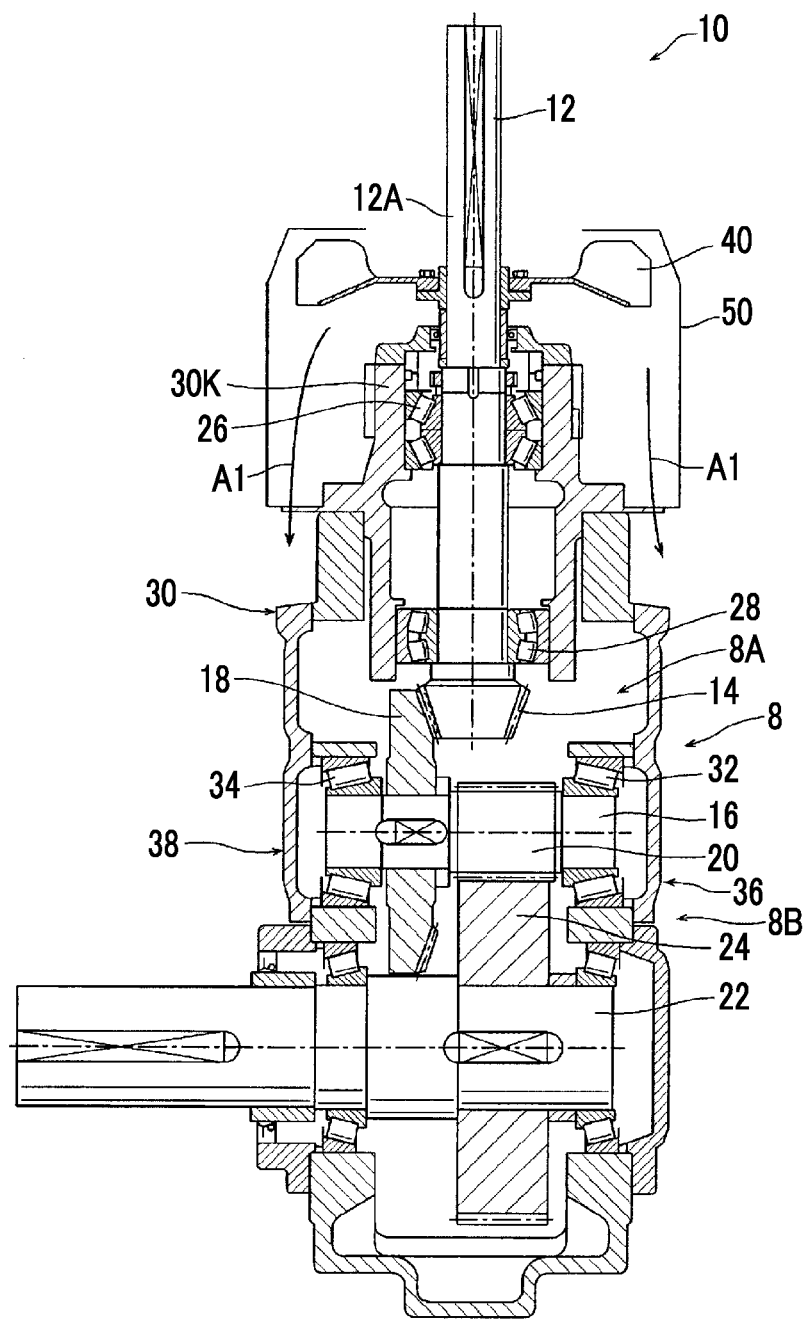
FIG. 9 is a plan cross-sectional view of a power train of the speed reducer.

FIG. 1 is a perspective view showing the structure of a speed reducer (power transmission apparatus) 10 according to the example of the embodiment of the invention, FIG. 2 is a plan view of the speed reducer, FIG. 3 is a cross-sectional view taken along line III-III of FIG. 2, FIGS. 4 to 8 are a front view, a right side view, a left side view, a rear view, and a bottom view of the speed reducer 10, respectively, except for a plan view, and FIG. 9 is a plan cross-sectional view of a power train of the speed reducer 10. Additionally, FIG. 9 is a view illustrating the power train, and does not necessarily match FIGS. 1 to 8 in terms of dimensions and the like.

First, the structure of the power train of the speed reducer 10 will be described briefly with reference to FIG. 9.

The speed reducer 10 includes a two-stage speed reduction mechanism 8 that includes an orthogonal speed reduction mechanism 8A and a parallel axis speed reduction mechanism 8B. That is, the speed reducer 10 is an orthogonal speed reducer that includes a bevel pinion 14 provided at the tip of an input shaft 12 and a bevel gear 18 provided on an intermediate shaft 16 and meshing with the bevel pinion 14. The intermediate shaft 16 is provided with an intermediate pinion 20, and the intermediate pinion 20 meshes with an output gear 24 that is provided on an output shaft 22.

The input shaft 12 is supported by a motor-side bearing 26 and an opposite motor-side bearing 28. The motor-side bearing 26 of the input shaft 12 is accommodated in a bearing casing 30K that is disposed so as to protrude from a casing 30 (as a part of the casing 30).

The input shaft 12 includes a protruding portion 12A that further protrudes from the bearing casing 30K. A fan 40 is mounted on the protruding portion 12A. Accordingly, it is possible to more actively cool the casing 30 of the speed reducer 10 by airflow that is caused by the fan 40 (airflow that is sent from the fan) in addition to natural cooling.

Figure 10:
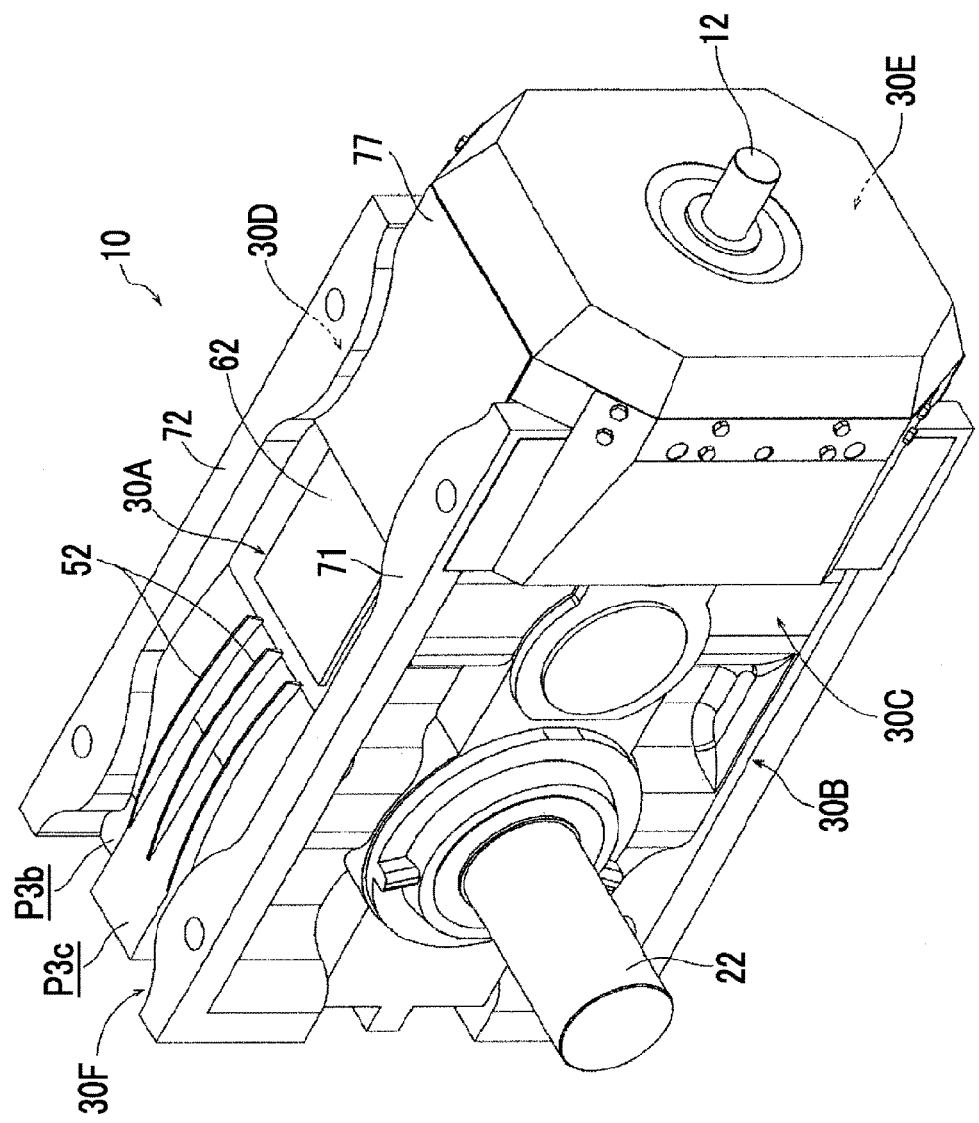
FIG. 10 is a perspective view showing the structure of a speed reducer (power transmission apparatus) according to an example of another embodiment of the invention and corresponding to FIG. 1.

Meanwhile, the fan 40 is provided with a fan cover 50 (not shown in the other drawings except for FIG. 9). For example, as shown in FIG. 10, the fan cover 50 may be integrated with an air guide cover 77. This structure will be described in detail later.

In this embodiment, airflow A1 sent from the fan 40 is more effectively used to further improve the cooling efficiency of the entire speed reducer 10. Detailed description will be made below.

As apparent from FIGS. 1 to 8, the entire casing 30 of the speed reducer 10 according to this embodiment is formed of a substantially rectangular parallelepiped. In this embodiment, fins 50 are provided on the "side surfaces" of the casing 30. Here, "the side surfaces of the casing 30" mean "surfaces, with which the airflow A1 sent from the fan 40 can come into contact, among the surfaces of the casing 30 and surfaces having a concept in which the sides of the surfaces close to the fan 40 in the direction of the airflow A1 (the upstream side of the airflow A1) and the sides of the surfaces distant from the fan 40 (the downstream side of the airflow A1)" are present. Specifically, in this embodiment, four surfaces, that is, an upper surface 30A, a lower surface 30B, a front surface 30C, and a rear surface 30D of the casing 30 correspond to "the side surfaces".

Meanwhile, a right side surface 30E on which the fan 40 is mounted and a left side surface 30F, which is an opposite fan mounting surface, do not have a concept in which the sides of the right and left side surfaces 30E and 30F close to the fan 40 or the sides of the right and left side surfaces 30E and 30F distant from the fan 40 are present. Accordingly, the right and left side surfaces 30E and 30F do not correspond to "the side surfaces of the casing 30" of this embodiment.

In this embodiment, fins 50 are provided on two side surfaces facing each other, specifically, the upper and lower surfaces 30A and 30B among the four side surfaces, that is, the upper surface 30A, the lower surface 30B, the front surface 30C, and the rear surface 30D. The fins 50 are bonded to the upper and lower surfaces 30A and 30B by, for example, welding or a heat resistant adhesive. Meanwhile, for example, a plate formed integrally with fins may be connected to the upper surface 30A or the lower surface 30B by bolts or the like. In addition, fins may be formed integrally with the casing.

Meanwhile, as apparent from the plan view of FIG. 2 and the bottom view of FIG. 8, the upper and lower surfaces 30A and 30B are provided with the fins 50 with completely the same appearance. Accordingly, in the following description, the fins 50 formed on the upper surface 30A will be described, the fins 50 formed on the lower surface 30B will be denoted in FIG. 8 by the same reference numeral, and repeated description will be omitted.

The fins 50 include upstream fins 51 that are close to the fan 40 and downstream fins 52 that are distant from the fan 40. Specifically, seven upstream fins 51 and three downstream fins are provided in this embodiment. An interval L1 between the upstream fins 51 is smaller than an interval L2 between the downstream fins 52. Further, the width W1 of the upstream fins 51 (the length of the upstream fins in a direction orthogonal to the flow direction of airflow) is greater than the width W2 of the downstream fins 52.

Furthermore, the height H1 of the upstream fins 51 is greater than the height H3 of the downstream fins 52 as shown in FIG. 3. Here, the concept of "the height of the fins" is different from the concept of the absolute height of the speed reducer 10 from an installation surface 80 (the absolute height of the speed reducer 10 from the installation surface 80 on the side close to the upstream fins 51 is H7 and the absolute height of the speed reducer 10 from the installation surface 80 on the side close to the downstream fins 52 is H8, and H8 on the side close to the downstream fins 52 is greater). However, a factor of the fins 50 contributing to cooling is "the height of the fins from the surface on which the fins stand". Accordingly, "the height of the fins" in this embodiment means "the maximum value of the heights of the fins from the surface on which the fins stand".

"The surface on which the fins stand" will be further described. In this embodiment, the casing 30 is provided with the upstream fins 51 and the downstream fins 52 on each of the upper and lower surfaces 30A and 30B that are two surfaces facing each other among the four side surfaces 30A to 30D. However, the upper and lower surfaces 30A and 30B are inclined so that a distance between the upper and lower surfaces 30A and 30B facing each other is gradually increased to L4 from L3 toward the side distant from the fan 40 from the side close to the fan 40 (so as to receive the airflow A1). For this reason, an upstream-side length of distances L5 and L6 from a central horizontal plane (a plane including axes O1 and O2 of the input and output shafts 12 and 22) Cp of the casing 30 in a height direction is smaller (L5<L6). More specifically, a surface 30A1 on which the upstream fins 51 stand is an inclined flat surface, and a surface 30A2 on which the downstream fins 52 stand is a curved surface.

Further, "the maximum value of the heights of the fins" will be described. In this embodiment, the height of the upstream fins 51 from the surface 30A1, on which the upstream fins 51 stand, is the maximum height H1 on the upstream side of the airflow A1, and is changed to the smaller H2 on the downstream side of the airflow A1 (H1>H2). Accordingly, the height of the upstream fins 51 in this embodiment is defined as "the maximum value of the heights of the fins from the surface on which the fins stand", and is H1. Meanwhile, the height of the downstream fins 52 from the surface 30A2 on which the downstream fins 52 stand is the largest H3 on the upstream side of the airflow A1, is reduced toward the downstream side of the airflow A1, and becomes 0 on the most downstream side of the airflow A1. Accordingly, the height of the downstream fins 52 of this embodiment is H3. Further, the height H1 of the upstream fins 51 is greater than the height H3 of the downstream fins 52 (H1>H3).

In this embodiment, an inspection hole 60 of the speed reducer 10 is provided between the upstream fins 51 and the downstream fins 52. The height H5 of an upper portion of a lid body 62, which closes the inspection hole 60, (the height of the upper portion of the lid body 62 from the central horizontal plane (the plane including the axes O1 and O2 of the input and output shafts 12 and 22) Cp: see FIG. 3) is smaller than the height of an apex 51F that is present at the downstream end of the upstream fins 51, and is equal to the height of a bottom portion 51G that is present at the downstream end of the upstream fins 51 (the height H5 may be lower than or slightly larger than the height of the bottom portion 51G). Meanwhile, since the height H5 is a height from a surface 30A3 on which the inspection hole 60 is provided, the height H5 corresponds to "0 (the same height)". As shown in FIG. 3, a thick portion of the lid body 62, that is, a counterbore 60A is formed in this embodiment in order to achieve this (Meanwhile, the lid body 62 is not shown in the cross-sectional view of FIG. 3). These structures are provided according to the consideration that allows (the lid body 62 for) the inspection hole 60 not to inhibit the flow of airflow A1.

Moreover, in this embodiment, vertical walls 71 and 72 stand at both end portions of the upper and lower surfaces 30A and 30B (on which the upstream and downstream fins 51 and 52 are provided) along a flow direction X of the airflow A1 of the fan 40. The vertical walls 71 and 72 stand so that a distance between the vertical walls 71 and 72 is reduced to W5 and W6 in regions P1 and P2 corresponding to the upstream and downstream fins 51 and 52 in the flow direction X of the airflow A1, respectively. In more detail, the vertical walls 71 and 72 are curved so that positions P1$m$ and P2$m$ where the distance between the vertical walls 71 and 72 becomes the minimum (W5 and W6) in the regions P1 and P2 corresponding to the upstream and downstream fins 51 and 52 are shifted to the side more distant from the fan 40 than longitudinal middle positions P1$c$ and P2$c$ of the upstream and downstream fins 51 and 52 by distances L8 and L9.

In addition, in this embodiment, a region P3$a$, which corresponds to a formation region of the downstream fins 52 in the width direction W, of a region P3, which is more distant from the fan 40 than the downstream fins 52 of the upper and lower surfaces 30A and 30B (on which the upstream and downstream fins 51 and 52 are provided), is more convex than both sides P3$b$ thereof in the width direction.

Further, the casing 30 of this embodiment includes surfaces (that is, the front and rear surfaces 30C and 30D) crossing the upper and lower surfaces 30A and 30B (on which the upstream and downstream fins 51 and 52 are provided), and curved recesses 74A to 74C, which are recessed from base surfaces 30C1 and 30D1, are formed on the front and rear surfaces 30C and 30D that are the surfaces crossing the upper and lower surfaces 30A and 30B.

Next, the action of the speed reducer 10 will be described.

When power is supplied from a drive source and the input shaft 12 is rotated, corresponding heat is generated in the casing 30 by the meshing between the bevel pinion 14 and the bevel gear 18; the meshing between the intermediate pinion 20 and the output gear 24; or the rolling of the bearings 26, 28, 32, and 34 supporting the input shaft 12, the intermediate shaft 16, and the output shaft 22 with which these gears are assembled and the rolling of the bearings supporting the output shaft 22, or the like.

This heat does not particularly cause problems in most usage environments (even in the speed reducer in the related art). However, when the speed reducer is continuously operated under, for example, a high-temperature environment, an oil film may not be easily formed due to the excessive rise of the temperature of lubricating oil. For this reason, there is a concern that a trouble such as the reduction of the life of the gears or bearings may occur.

Generally, there are, for example, a method of mounting a fan having larger capacity, a method of using a speed reducer including a larger (1 to 2 rank-large) casing, and the like as countermeasures against this trouble. However, when a fan having larger capacity is mounted, noise is increased and the loss of pressure is increased. Further, when a larger speed reducer is used for the countermeasures against heat, costs are significantly increased and a demerit in handling, such as the increase of weight, also becomes remarkable.

In contrast, in this embodiment, the casing is cooled by the following action while the change of the design of the fan 40 or the casing 30 is suppressed to the minimum (or the design of the fan 40 or the casing 30 is basically not changed). That is, when the input shaft 12 is rotated, the fan 40 mounted on the input shaft 12 is rotated. The airflow A1 sent from the fan 40 flows along the four side surfaces of the casing 30, that is, the upper surface 30A, the lower surface 30B, the front surface 30C, and the rear surface 30D.

The fins 50 are provided on the upper and lower surfaces 30A and 30B of the casing 30 of the power transmission apparatus according to this embodiment, and the interval L1 between the upstream fins 51 close to the fan 40 is smaller than the interval L2 between the downstream fins 52 distant from the fan 40. As a result, since the interval L1 between the upstream fins 51 is small on the side close to the fan 40 (the upstream side of the airflow A1), the contact area between the airflow A1 and the upstream fins 51 is increased. Accordingly, heat exchanging efficiency is improved. On the other hand, since the interval L2 between the downstream fins 52 is large on the side distant from the fan 40 (the downstream side of the airflow A1), the loss of pressure is reduced. Accordingly, the flow of the airflow A1 is not inhibited. Meanwhile, the fact that this action contributes to the suppression of the rise of the temperature of the casing 30 by improving the cooling efficiency of the entire casing 30 as a result was confirmed by tests of the inventors.

In addition, in this embodiment, the upstream and downstream fins 51 and 52 are provided on two side surfaces, which face each other, among the four side surfaces 30A to 30D of the casing 30, that is, the upper and lower surfaces 30A and 30B, respectively. For this reason, it is possible to efficiently cool the casing 30 from both sides of the casing 30 (from a vertical direction in this embodiment). Meanwhile, since the upper and lower surfaces 30A and 30B, which are the two side surfaces facing each other, do not support the shafts (bearings) and have a simple structure in this embodiment, it is easy to form the fins 50. Moreover, any one of the upper and lower surfaces 30A and 30B may be used as an installation surface according to the output direction of the output shaft 22.

Further, since the height H1 of the upstream fins 51 is set to be greater than the height H3 of the downstream fins 52, it is possible to efficiently exchange heat with the airflow A1 that is close to the fan 40 (cold and strong).

Furthermore, in this embodiment, the height H5 of the upper surface of the lid body 62 (closing the inspection hole 60), which is disposed between the upstream and downstream fins 51 and 52, is set to be smaller than the height of the apex 51F of the upstream fins 51 and is set to be low up to the same level as the bottom portion 51G. Accordingly, it is possible to make the airflow A1 reach the downstream fins 52 without reducing the strength of the airflow A1 that has flowed through the upstream fins 51. For this reason, the loss of pressure is reduced, so that the strong flow of the airflow A1 can be maintained.

Moreover, since the vertical walls 71 and 72 stand on the upper and lower surfaces 30A and 30B (on which the upstream and downstream fins 51 and 52 are formed) along the flow direction X of the airflow A1 of the fan 40 in this embodiment, it is possible to prevent the airflow A1 from being diffused in a horizontal direction and to make the airflow A1, which is sent from the fan 40, efficiently come into contact with the fins 50. In particular, since the vertical walls 71 and 72 are present on the lower surface 30B facing the installation surface 80, it is possible to make the airflow A1, which is sent from the fan 40, come into contact with the fins 50 without diffusing the airflow A1 in both the width direction and the height direction. Accordingly, it is possible to very efficiently cool the casing. Meanwhile, since the interval L2 between the downstream fins 52 is larger (than the interval L1 between the upstream fins 51) and the height of the fins is also set to be small in this embodiment, it is possible to make the airflow A1 flow with a small loss of pressure even though the vertical walls 71 and 72 are formed. Accordingly, it is possible to efficiently cool the casing.

In addition, in this embodiment, the vertical walls 71 and 72 stand so that the distance between the vertical walls 71 and 72 is reduced to W5 and W6 in the regions P1 and P2 corresponding to the upstream and downstream fins 51 and 52 in the flow direction of the airflow A1. For this reason, since it is possible to increase flow speed when the airflow A1 passes through the upstream and downstream fins 51 and 52, it is possible to more efficiently exchange heat. Further, since the vertical walls 71 and 72 are curved so that the positions P1$m$ and P2$m$ where the distance between the vertical walls 71 and 72 becomes the minimum (W5 and W6) in the regions P1 and P2 corresponding to the upstream and downstream fins 51 and 52 are set to the positions (shifted positions) more distant from the fan 40 than the longitudinal middle positions P1$c$ and P2$c$ of the upstream and downstream fins 51 and 52 by distances L8 and L9 in this case, it is possible to make the airflow A1 flow to the downstream side so that the airflow A1 is widely collected and flows into the regions P1 and P2 corresponding to the upstream and downstream fins 51 and 52. Accordingly, it is possible to more effectively obtain an action that increases the flow speed of the airflow A1.

Furthermore, in this embodiment, the upper and lower surfaces 30A and 30B (on which the upstream and downstream fins 51 and 52 are provided) are inclined so that the distance between the upper and lower surfaces 30A and 30B is increased to L4 from L3 toward the side distant from the fan 40 from the side close to the fan 40 (that is, the entirety of upper and lower surfaces 30A and 30B receive the airflow A1). Accordingly, since it is possible to prevent the airflow A1 from being separated (or divided) in the vertical direction of the casing 30 as much as possible, it is possible to further reliably obtain the above-mentioned action.

Further, in the embodiment, the region P3$a$, which corresponds to a formation region of the downstream fins 52 in the width direction, of the region P3, which is more distant from the fan 40 than the downstream fins 52 of the upper and lower surfaces 30A and 30B on which the upstream and downstream fins 51 and 52 are provided, is more convex than both sides P3$b$ thereof. For this reason, it is possible to suppress the loss of pressure by spaces, which are ensured on both sides P3$b$ of the region P3$a$ in the width direction, while suppressing the separation between the downstream fins 52 and the airflow A1 to the minimum.

Furthermore, in the embodiment, the curved recesses 74 (74A to 74C) are formed on the front and rear surfaces 30C and 30D crossing the upper and lower surfaces 30A and 30B of the casing 30. Accordingly, when the airflow A1 appropriately flows into the recesses 74, it is possible to further prevent the airflow from being separated from the casing 30 in the front and rear surfaces 30C and 30D and to further improve the cooling effect even on the front and rear surfaces 30C and 30D.

Meanwhile, when a fan cover (50) of the fan 40 is formed to be larger than usual and positions, which correspond to the upstream fins 51, of the upper and lower surfaces 30A and 30B are covered with an air guide cover 77 shown in FIG. 10 as a modification of this embodiment, it is possible to further suppress the separation (division) of the airflow A1 from the side surfaces 30A to 30D of the casing 30. In particular, two vertical walls 71 and 72 are present on the upper and lower surfaces 30A and 30B, and the air guide cover 77 of FIG. 10 can make airflow A1, which is sent from the fan 40, reliably come into contact with not only the upstream fins 51 but also the downstream fins 52. Further, since the example of the air guide cover 77 of FIG. 10 is adapted to cover not only the upstream fins 51 but also the positions, which correspond to the upstream fins 51, of the front and rear surfaces 30C and 30D, almost all of the amount of the airflow A1, which is sent from the fan 40, flows along the four side surfaces (without being separated from the casing 30). Accordingly, it is possible to further efficiently use the airflow A1.

Meanwhile, the (orthogonal) speed reducer 10 has been exemplified as the power transmission apparatus in the embodiment, but the power transmission apparatus according to the embodiment of the invention does not necessarily need to be a speed reducer having this structure (one orthogonal speed reduction stage+one parallel axis speed reduction stage) and may be, for example, a speed reducer that includes one orthogonal speed reduction stage and two parallel axis speed reduction stages. Further, the invention can be applied to, for example, a speed reducer including only a parallel axis speed reduction stage. Furthermore, since the invention is not originally limited to a speed reducer and can be applied to "a power transmission apparatus which is cooled by airflow sent from a fan and includes fins provided on side surfaces of a casing", the same cooling effect is obtained.

Further, even in regard to "the airflow sent from the fan", the fan 40 has been mounted on the input shaft 12 of the speed reducer (power transmission apparatus) 10 in the embodiment but the fan does not need to be assembled with the power transmission apparatus. For example, when a motor, a front-stage speed reducer, a fluid coupling, or the like is connected to the power transmission apparatus, the motor, the front-stage speed reducer, or the like is provided with a fan, and airflow sent from the fan can be used for cooling or substantially the same airflow, which is caused by the rotation of the fluid coupling, as the airflow of the fan can be used, the power transmission apparatus does not necessarily need to include a fan. Furthermore, the airflow of a fan, which is installed completely separately from the power transmission apparatus or a device connected to the power transmission apparatus and is independently driven, may be used.

Further, the upstream and downstream fins 51 and 52 according to the embodiment of the invention have been provided on the upper and lower surfaces 30A and 30B, which are two surfaces facing each other, among the four side surfaces 30A to 30D in the embodiment. However, if the upstream and downstream fins are only formed on at least one side surface in the invention, corresponding effect is obtained. Of course, the upstream and downstream fins according to the embodiment of the invention may be provided on, for example, three surfaces or all of four surfaces. Accordingly, it is possible to further improve the cooling effect. A plurality of upstream and downstream fins only have to be provided, and the number thereof is not particularly limited.

Furthermore, in the embodiment, the height H1 of the upstream fins 51 has been set to be greater than the height H3 of the downstream fins 52 to further improve the cooling efficiency of, particularly, the upstream fins 51. However, in the invention, the setting of the height of each fin is not particularly limited and the fins having, for example, the same height may be formed.

Further, the installation of the air guide cover (77) is also not necessarily essential, and the height (H5) of the upper surface of the lid body (62), which closes the inspection hole (60), also does not necessarily need to be greater than the height of the upstream fins (51). For example, the lid body (62) may also be provided with fins. Meanwhile, in the invention, considering "the upstream fins close to the fan" and "the downstream fins more distant from the fan than the downstream fins" at two specific positions, it is preferable that the interval between the upstream fins is smaller than the interval between the downstream fins. In other words, for example, a structure in which two fins having a large interval are formed at the ends of the lid body in the width direction in addition to the above-mentioned structure, a structure in which fins, which have an interval larger than the interval between the downstream fins, are formed between the upstream and downstream fins, and the like are also included in the category of the invention.

Furthermore, the vertical walls 71 and 72 have stood at both end portions of the side surfaces on which the upstream and downstream fins 51 and 52 are formed in the embodiment, but the formation of the vertical walls is not necessarily essential. Moreover, even when the vertical walls stand, the distance between the vertical walls does not necessarily need to be reduced in the region corresponding to, for example, the upstream or downstream fins. Further, even when the distance between the vertical walls is reduced, a portion where the distance between the vertical walls becomes the minimum does not necessarily need to be shifted to the side more distant from the fan than the longitudinal middle position of the upstream or downstream fins and, for example, the distance between the vertical walls at the longitudinal middle position may be the smallest.

Furthermore, the inclination of the side surfaces on which the fins are provided is also not necessarily essential, and for example, the side surface parallel to the central horizontal plane may be a base.

Moreover, the curved recesses (of the side surfaces crossing the side surfaces on which the fins are provided) having been provided in the embodiment are also not necessarily essential (may not necessarily be provided).

The invention can be used in a power transmission apparatus.

It should be understood that the invention is not limited to the above-described embodiment, but may be modified into various forms on the basis of the spirit of the invention. Additionally, the modifications are included in the scope of the invention.

What is claimed is:

1. A power transmission apparatus that is cooled by airflow sent from a fan and includes fins provided on at least one of side surfaces of a casing,
    wherein the fins include upstream fins and downstream fins, the upstream fins are closer to the fan than the downstream fins,
    an interval between the upstream fins is smaller than an interval between the downstream fins,
    an inspection hole of the power transmission apparatus is provided between the upstream and downstream fins, and
    a height of an upper surface of a lid body, which closes the inspection hole, is smaller than a height of an apex of the upstream fins.

2. The power transmission apparatus according to claim 1, wherein all of the upstream fins and all of the downstream fins fall within a width of the fan when seen in an axial direction of the fan in a plan view of the side surface where the upstream fins and the downstream fins are provided.

3. The power transmission apparatus according to claim 1, wherein the upstream fins and the downstream fins are provided on two of the side surfaces, which face each other.

4. The power transmission apparatus according to claim 1, wherein a height of the upstream fins is greater than a height of the downstream fins.

5. The power transmission apparatus according to claim 1, wherein the upstream fins are covered with an air guide cover.

6. The power transmission apparatus according to claim 1, wherein the height of the upper surface of the lid body is equal to or smaller than a height of a bottom portion of the upstream fins.

7. The power transmission apparatus according to claim 1, wherein a vertical wall stands at each of two end portions of the side surface, on which the upstream fins and the downstream fins are formed, along a flow direction of the airflow of the fan.

8. The power transmission apparatus according to claim 7, wherein the vertical walls stand so that a distance between the vertical walls is reduced at a position corresponding to the upstream or downstream fins in the flow direction of the airflow.

9. The power transmission apparatus according to claim 8, wherein a portion where the distance between the vertical walls becomes the minimum at the position corresponding to the upstream fins or the downstream fins is positioned on a side, which is more distant from the fan than a longitudinal middle of the upstream fins or the downstream fins.

10. The power transmission apparatus according to claim 1, wherein the side surface on which the upstream fins and the downstream fins are provided is inclined so that a distance between the side surfaces facing each other is increased toward a side distant from the fan from a side close to the fan.

11. The power transmission apparatus according to claim 1, wherein curved recesses are formed on the side surface perpendicular to the side surface on which the upstream fins and the downstream fins are provided.

12. The power transmission apparatus according to claim 1, wherein all of the downstream fins fall within a width in which the upstream fins are provided.

* * * * *